(12) United States Patent
Fukushi et al.

(10) Patent No.: US 12,394,658 B2
(45) Date of Patent: Aug. 19, 2025

(54) METHOD OF PROCESSING PLATE-SHAPED WORKPIECE

(71) Applicant: DISCO CORPORATION, Tokyo (JP)

(72) Inventors: Nobuyuki Fukushi, Tokyo (JP); Kosei Kiyohara, Tokyo (JP); Shohei Takeda, Tokyo (JP); Gentaro Tsuruta, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 501 days.

(21) Appl. No.: 17/931,591

(22) Filed: Sep. 13, 2022

(65) Prior Publication Data

US 2023/0099416 A1  Mar. 30, 2023

(30) Foreign Application Priority Data

Sep. 27, 2021 (JP) .................. 2021-156352

(51) Int. Cl.
*H01L 21/683* (2006.01)
*B23K 26/38* (2014.01)
*H01L 21/67* (2006.01)
*H01L 21/78* (2006.01)

(52) U.S. Cl.
CPC .......... *H01L 21/6836* (2013.01); *B23K 26/38* (2013.01); *H01L 21/67092* (2013.01); *H01L 21/78* (2013.01); *H01L 2221/68336* (2013.01); *H01L 2221/68386* (2013.01)

(58) Field of Classification Search
None
See application file for complete search history.

(56) References Cited

U.S. PATENT DOCUMENTS

| | | | | |
|---|---|---|---|---|
| 5,888,883 | A | * | 3/1999 | Sasaki ................. H01L 21/6835 438/464 |
| 2004/0002199 | A1 | * | 1/2004 | Fukuyo ................ C03B 33/023 438/106 |
| 2005/0269717 | A1 | * | 12/2005 | Ohashi ................ H01L 21/6836 257/E21.599 |

(Continued)

FOREIGN PATENT DOCUMENTS

| JP | 10242083 A | 9/1998 |
|---|---|---|
| JP | 2002222988 A | 8/2002 |

(Continued)

OTHER PUBLICATIONS

Translation of JP2019201052A (Year: 2019).*

(Continued)

*Primary Examiner* — Erik T. K. Peterson
(74) *Attorney, Agent, or Firm* — Greer Burns & Crain Ltd.

(57) ABSTRACT

A method of processing a plate-shaped workpiece includes a workpiece supporting step of placing the plate-shaped workpiece on a thermocompression sheet whose area is larger than that of the plate-shaped workpiece, heating the thermocompression sheet to pressure-bond the thermocompression sheet to the plate-shaped workpiece, and supporting the plate-shaped workpiece on only the thermocompression sheet, a processing step of processing the plate-shaped workpiece to divide the plate-shaped workpiece into a plurality of chips, and a pick-up step of picking up the chips from the thermocompression sheet.

12 Claims, 5 Drawing Sheets

(56) References Cited

U.S. PATENT DOCUMENTS

| | | | |
|---|---|---|---|
| 2006/0261050 A1* | 11/2006 | Krishnan | B23K 26/364 |
| | | | 219/121.72 |
| 2009/0091044 A1* | 4/2009 | Seo | H01L 21/6836 |
| | | | 438/114 |
| 2014/0179083 A1* | 6/2014 | Buenning | B23K 26/53 |
| | | | 219/121.67 |
| 2019/0348327 A1* | 11/2019 | Harada | B23K 26/40 |
| 2019/0378745 A1* | 12/2019 | Harada | C09J 7/35 |
| 2020/0013676 A1* | 1/2020 | Harada | H01L 21/67092 |
| 2020/0043772 A1* | 2/2020 | Harada | H01L 21/6836 |
| 2020/0043789 A1* | 2/2020 | Harada | H01L 21/3043 |
| 2020/0083104 A1* | 3/2020 | Harada | H01L 21/3043 |
| 2020/0185253 A1* | 6/2020 | Harada | H01L 21/268 |
| 2020/0235011 A1* | 7/2020 | Harada | H01L 21/67132 |
| 2020/0266090 A1* | 8/2020 | Harada | B23K 37/0408 |
| 2020/0266102 A1 | 8/2020 | Harada et al. | |
| 2020/0266103 A1* | 8/2020 | Sekiya | B32B 27/36 |
| 2020/0286785 A1* | 9/2020 | Harada | H01L 21/78 |
| 2020/0328118 A1* | 10/2020 | Harada | H01L 21/67132 |
| 2020/0335382 A1* | 10/2020 | Yamamoto | H01L 21/6838 |
| 2020/0357695 A1* | 11/2020 | Harada | H01L 21/268 |
| 2020/0388536 A1 | 12/2020 | Harada et al. | |
| 2020/0388537 A1* | 12/2020 | Harada | B23K 26/40 |
| 2021/0013100 A1* | 1/2021 | Harada | H01L 21/78 |
| 2021/0043514 A1* | 2/2021 | Harada | H01L 21/6838 |

FOREIGN PATENT DOCUMENTS

| | | |
|---|---|---|
| JP | 2003179006 A | 6/2003 |
| JP | 2004188475 A | 7/2004 |
| JP | 2014165338 A | 9/2014 |
| JP | 2019201052 A | 11/2019 |
| JP | 2020024974 A | 2/2020 |
| JP | 2020024988 A | 2/2020 |
| JP | 2020178008 A | 10/2020 |
| JP | 2020188057 A | 11/2020 |

OTHER PUBLICATIONS

EESR issued in counterpart European patent application No. EP 22 19 6527, dated Mar. 31, 2023.

Office Action issued in counterpart Japanese patent application No. 2021-156352, dated May 13, 2025.

* cited by examiner

METHOD OF PROCESSING PLATE-SHAPED WORKPIECE

BACKGROUND OF THE INVENTION

Field of the Invention

The present invention relates to a method of processing a plate-shaped workpiece.

Description of the Related Art

Wafers having, on their face sides, a plurality of devices such as integrated circuits (ICs) or large-scale integration (LSI) circuits formed in respective areas demarcated by a plurality of projected dicing lines are divided into individual device chips by a cutting apparatus or a laser processing apparatus. The device chips will be used in electronic appliances such as mobile phones and personal computers.

After such a wafer has been divided into individual device chips, a pick-up step is carried out on the device chips that are still kept together in a wafer configuration similar in shape to the wafer as a whole. Heretofore, as illustrated in FIG. 7 of the accompanying drawings, it has been the general practice to support a wafer 10 by an adhesive tape T on an annular frame F having an opening Fa that is defined centrally therein and that accommodates the wafer 10 therein and to deliver the wafer 10 thus supported to a cutting apparatus or a laser processing apparatus for processing the wafer 10 (see, for example, Japanese Patent Laid-open No. Hei 10-242083, Japanese Patent Laid-open No. 2002-222988, and Japanese Patent Laid-open No. 2004-188475). The wafer 10 illustrated in FIG. 7 is a circular, plate-shaped workpiece having devices 12 formed in respective areas demarcated on a face side 10a thereof by a grid of projected dicing lines 14. The frame F has a pair of recesses Fb and Fc defined in an outer circumferential edge portion thereof for distinguishing between face and reverse sides of the frame F and defining a direction in which the frame F supports the wafer 10.

SUMMARY OF THE INVENTION

The processing apparatus disclosed in Japanese Patent Laid-open No. Hei 10-242083, Japanese Patent Laid-open No. 2002-222988, and Japanese Patent Laid-open No. 2004-188475 described above repetitively uses the frame F for supporting the wafer 10. Therefore, after the wafer 10 supported by the frame F has been processed, the adhesive tape T is removed from the frame F, and thereafter the frame F is retrieved. The retrieved frame F is serviced for maintenance, e.g., cleaned to remove debris, an adhesive, etc., deposited on the frame F and stored in a given place until it will be used to support a wafer. However, since the maintenance process is tedious and time-consuming, the overall process for processing wafers is low in productivity.

It is therefore an object of the present invention to provide a method of processing a plate-shaped workpiece with higher productivity without the need for a maintenance process for a frame that supports the plate-shaped workpiece.

In accordance with an aspect of the present invention, there is provided a method of processing a plate-shaped workpiece, including a workpiece supporting step of placing the plate-shaped workpiece on a thermocompression sheet whose area is larger than that of the plate-shaped workpiece, heating the thermocompression sheet to pressure-bond the thermocompression sheet to the plate-shaped workpiece, and supporting the plate-shaped workpiece on only the thermocompression sheet, a processing step of processing the plate-shaped workpiece to divide the plate-shaped workpiece into a plurality of chips, and a pick-up step of picking up the chips from the thermocompression sheet.

Preferably, the method further includes an expanding step of expanding the thermocompression sheet to widen distances between the chips. Preferably, the method further includes after the pick-up step, a discarding step of discarding the thermocompression sheet.

Preferably, the plate-shaped workpiece includes a wafer including a face side having a plurality of devices formed in respective areas demarcated thereon by a plurality of projected dicing lines, the face side of the wafer or a reverse side thereof being placed on the thermocompression sheet. Preferably, the thermocompression sheet is either one of a polyolefin-based sheet and a polyester-based material.

The polyolefin-based sheet may be either one of a polyethylene sheet, a polypropylene sheet, and a polystyrene sheet. Preferably, if the polyethylene sheet is selected as the thermocompression sheet, a heating temperature to which the thermocompression sheet is heated in the workpiece supporting step ranges from 120° C. to 140° C., if the polypropylene sheet is selected as the thermocompression sheet, a heating temperature to which the thermocompression sheet is heated in the workpiece supporting step ranges from 160° C. to 180° C., and if the polystyrene sheet is selected as the thermocompression sheet, a heating temperature to which the thermocompression sheet is heated in the workpiece supporting step ranges from 220° C. to 240° C.

The polyester-based sheet is either one of a polyethylene terephthalate sheet and a polyethylene naphthalate sheet. Preferably, if the polyethylene terephthalate sheet is selected as the thermocompression sheet, a heating temperature to which the thermocompression sheet is heated in the workpiece supporting step ranges from 250° C. to 270° C., and if the polyethylene naphthalate sheet is selected as the thermocompression sheet, a heating temperature to which the thermocompression sheet is heated in the workpiece supporting step ranges from 160° C. to 180° C.

Since the method of processing a plate-shaped workpiece according to the aspect of the present invention includes a workpiece supporting step of placing the plate-shaped workpiece on an upper surface of a thermocompression sheet whose area is larger than that of the plate-shaped workpiece, heating the thermocompression sheet to pressure-bond the thermocompression sheet to the plate-shaped workpiece, and supporting the plate-shaped workpiece on only the thermocompression sheet, a processing step of processing the plate-shaped workpiece to divide the plate-shaped workpiece into a plurality of chips, and a pick-up step of picking up the chips from the thermocompression sheet, a frame that has heretofore been used is not required and no tedious and time-consuming work has to be performed for maintenance to make such a frame reusable, so that the method of processing a plate-shaped workpiece is of increased productivity.

The above and other objects, features and advantages of the present invention and the manner of realizing them will become more apparent, and the invention itself will best be understood from a study of the following description and an appended claim with reference to the attached drawings showing a preferred embodiment of the invention.

DETAILED DESCRIPTION OF THE PREFERRED EMBODIMENT

A preferred embodiment of the present invention will be described hereinbelow with reference to the accompanying drawings.

Figure 1:
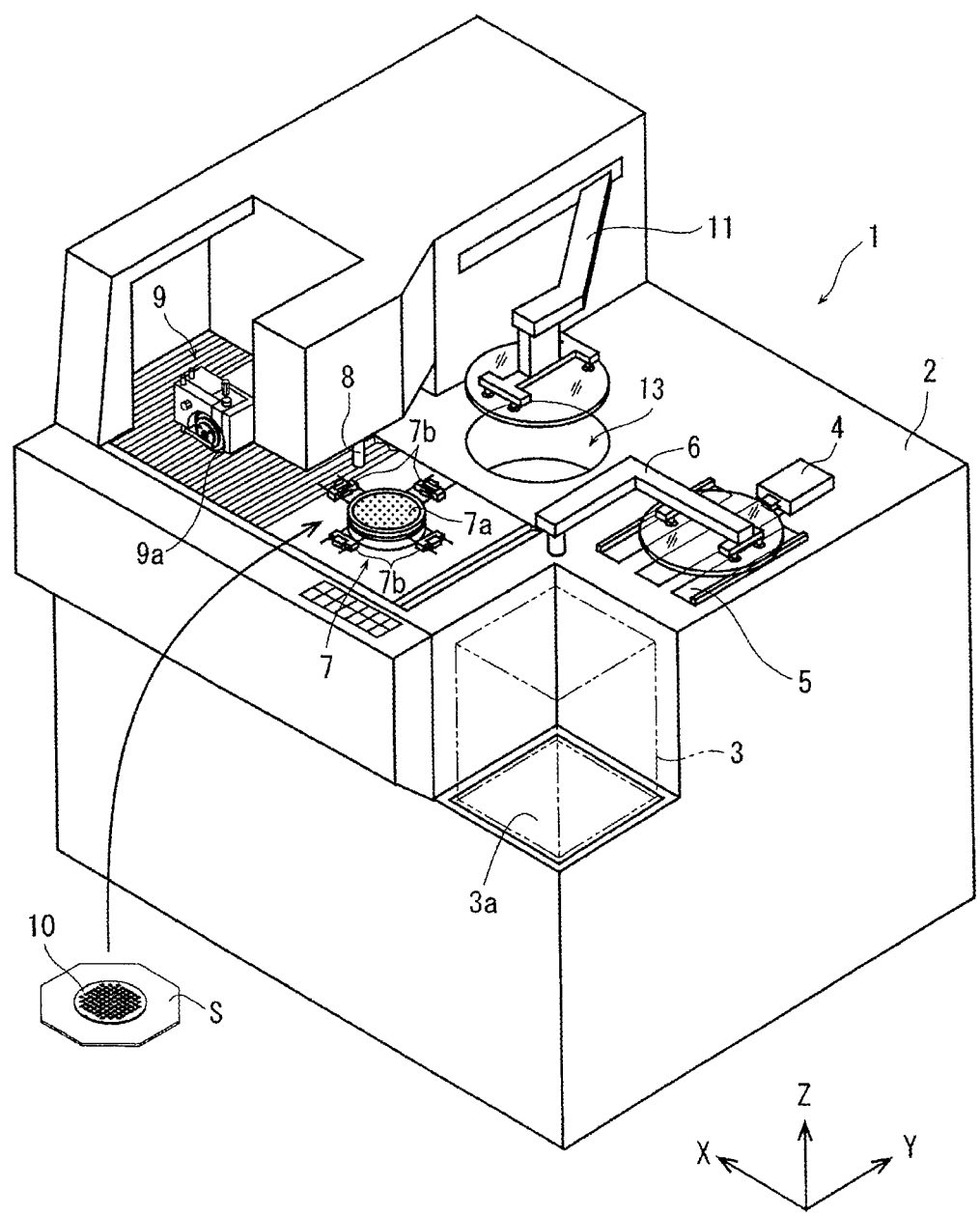
FIG. 1 is a perspective view of a cutting apparatus for use in a method of processing a plate-shaped workpiece according to an embodiment of the present invention.

FIG. 1 illustrates a cutting apparatus 1 in its entirety in perspective that is suitable for use in a method of processing a plate-shaped workpiece according to an embodiment of the present invention. As illustrated in FIG. 1, the cutting apparatus 1 is an apparatus for cutting a circular wafer 10 as the plate-shaped workpiece. The wafer 10 is similar to the wafer 10 described above with reference to FIG. 7, and is a semiconductor wafer made of silicon (Si), for example, having a plurality of devices 12 (see FIG. 4A) formed in respective areas demarcated on a face side 10a by a plurality of projected dicing lines 14.

The cutting apparatus 1 includes an apparatus housing 2. The wafer 10, which is the plate-shaped workpiece according to the present embodiment, has been pressure-bonded to a thermocompression sheet S in a workpiece supporting step, to be described later, and is supported on only the thermocompression sheet S. A plurality of wafers 10 each supported on the thermocompression sheet S are stored in a cassette 3, indicated by the two-dot-and-dash lines, that is delivered to the apparatus housing 2. The cassette 3 is placed on a vertically movable cassette table 3a disposed in the apparatus housing 2. One, at a time, of the wafers 10 stored in the cassette 3 is taken out of the cassette 3 and delivered onto a temporary rest table 5 on the apparatus housing 2 when a loading/unloading mechanism 4 grips the thermocompression sheet S and moves in a Y-axis direction to bring the wafer 10 on the thermocompression sheet S onto the temporary rest table 5.

The wafer 10 delivered to the temporary rest table 5 is attracted under suction by a delivery mechanism 6, which is then turned to deliver the wafer 10 to a chuck table 7 positioned in a loading/unloading area where the wafer 10 is to be loaded and unloaded. The wafer 10 delivered to the chuck table 7 is placed, with its reverse side 10b (see FIG. 4A) facing downwardly, on a suction chuck 7a of the chuck table 7 and held under suction thereon. Four clamps 7b that are angularly spaced at equal intervals around an outer circumferential surface of the chuck table 7 grip and secure the thermocompression sheet S in position.

The cutting apparatus 1 includes an alignment unit 8 and a cutting unit 9 that are disposed over an alignment area next to the loading/unloading area along the X-axis direction. The apparatus housing 2 houses therein an X-axis moving mechanism, not illustrated, for moving the chuck table 7 in the X-axis direction from the loading/unloading area to the alignment area next to it and also for processing-feeding the chuck table 7 in a processing area next to the alignment area, a Y-axis moving mechanism, not illustrated, for indexing-feeding a cutting blade 9a of the cutting unit 9 in a Y-axis direction perpendicular to the X-axis direction, and a Z-axis moving mechanism, not illustrated, for lifting and lowering the cutting blade 9a and incising-feeding the cutting blade 9a in the processing area. When the chuck table 7 and hence the wafer 10 placed thereon are moved in the X-axis direction by the X-axis moving mechanism to the alignment area, the alignment unit 8 with a camera function captures an image of the wafer 10 to detect a region of the wafer 10 to be cut by the cutting unit 9. The cutting unit 9 carries out a cutting step as follows.

The alignment unit 8 detects one of the projected dicing lines 14 as the region to be cut. The detected projected dicing line 14 is aligned with the X-axis direction and hence oriented in alignment with the cutting blade 9a in the alignment area. The chuck table 7 is then moved from the alignment area in the X-axis direction by the X-axis moving mechanism to position the aligned projected dicing line 14 in the processing area that is directly below the cutting blade 9a of the cutting unit 9. Then, the cutting blade 9a is rotated about its central axis, and lowered or incising-fed by the Z-axis moving mechanism while, at the same time, the chuck table 7 is processing-fed by the X-axis moving mechanism, thereby cutting the wafer 10 along the projected dicing line 14 to form a straight cut groove in the wafer 10 along the projected dicing line 14. After the straight cut groove has been formed in the wafer 10, the Z-axis moving mechanism lifts the cutting blade 9a, and the wafer 10 is indexing-fed a distance in the Y-axis direction up to an adjacent projected dicing line 14 by the Y-axis moving mechanism. Then, in the same manner as described above, the cutting blade 9a is incising-fed by the Z-axis moving mechanism and processing-fed in the X-axis direction by the X-axis moving mechanism while, at the same time, the chuck table 7 is processing-fed by the X-axis moving mechanism, thereby cutting the wafer 10 along the projected dicing line 14 to form a straight cut groove in the wafer 10 along the adjacent projected dicing line 14. The above process is repeated until straight cut grooves are formed in the wafer 10 along all the projected dicing lines 14 that extend in a predetermined direction. Thereafter, the chuck table 7 is turned 90 degrees about its central axis to align one of the projected dicing lines 14 that extend in a direction perpendicular to the straight cut grooves already formed in the wafer 10 with the X-axis direction. Then, the above cutting process is carried out again on the wafer 10 until straight cut grooves are formed in the wafer 10 along all the projected dicing lines 14 that extend in the direction perpendicular to the straight cut grooves. In this manner, straight cut grooves are formed in the wafer 10 along all the projected dicing lines 14 on the wafer 10. When the above cutting step has been performed on the wafer 10, the wafer 10 is divided along the cut grooves into individual device chips. At this time, since the individual device chips remain supported on the thermocompression sheet S, the device chips are still kept together in a wafer configuration similar in shape to the wafer 10 as a whole. The device chips that are divided but remain in the wafer configuration will also be referred to as the "wafer 10." The components described above of the cutting apparatus 1 are controlled in operation by a control unit, not illustrated.

The wafer 10 divided into the individual device chips in the cutting step described above is attracted under suction by a delivery mechanism 11 from the chuck table 7 that has been moved from the processing area to the loading/unloading area. Then, the wafer 10 is delivered to a cleaning device 13, details of which are omitted from illustration, by the delivery mechanism 11. The wafer 10 is then cleaned and dried by the cleaning device 13, and thereafter delivered to the temporary rest table 5 by the delivery mechanism 6. The wafer 10 is then placed back into a position in the cassette 3 by the loading/unloading mechanism 4. The cassette 3 on the cassette table 3a is vertically movable by the cassette table 3a to allow the wafer 10 to be stored in a desired one of storage positions arranged in a vertical array in the cassette 3.

The cutting apparatus 1 according to the present embodiment is of the above structure and operates as described above. The method of processing a plate-shaped workpiece according to the present embodiment is carried out as follows.

For performing the method of processing a plate-shaped workpiece according to the present embodiment, either one of a first thermocompression sheet S1 (see FIG. 2A) whose area is larger than that of the wafer 10, i.e., the face side 10a or the reverse side 10b thereof, and second through fourth thermocompression sheets S2, S3, and S4 (see FIGS. 2B, 2C, and 2D) according to modifications thereof is prepared as the thermocompression sheet S referred to above. Each of the first through fourth thermocompression sheets S1, S2, S3, and S4 is a thermocompression sheet that softens to produce adhesive power when heated, and may be either a polyolefin-based sheet or a polyester-based sheet, for example.

If a polyolefin-based sheet is selected as the thermocompression sheet S, then either one of a polyethylene (PE) sheet, a polypropylene (PP) sheet, and a polystyrene (PS) thermocompression sheet should preferably be selected as the thermocompression sheet S.

If a polyester-based sheet is selected as the thermocompression sheet S, then either one of a polyethylene terephthalate (PET) sheet and a polyethylene naphthalate (PEN) thermocompression sheet should preferably be selected as the thermocompression sheet S.

Figure 2A:
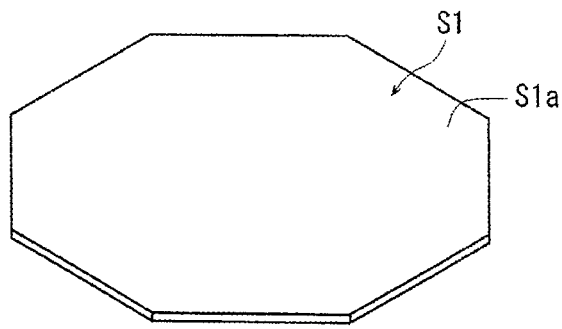
FIG. 2A is a perspective view of a thermocompression sheet according to the present embodiment.
Figure 2C:
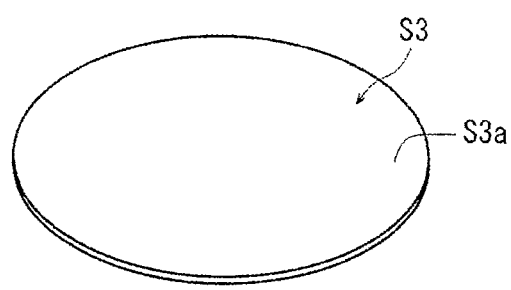
FIG. 2C is a perspective view of a thermocompression sheet according to another modification.
Figure 2B:
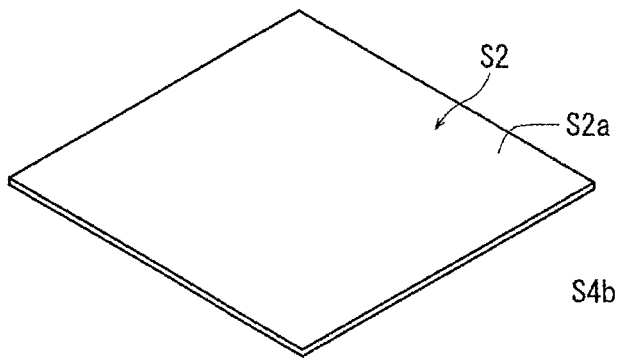
FIG. 2B is a perspective view of a thermocompression sheet according to a modification.
Figure 2D:
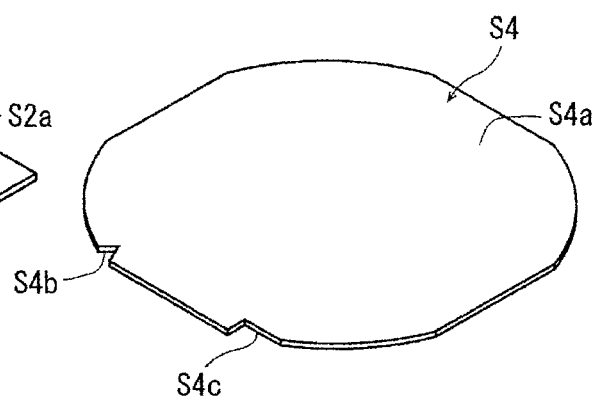
FIG. 2D is a perspective view of a thermocompression sheet according to still another modification.
Figure 7:
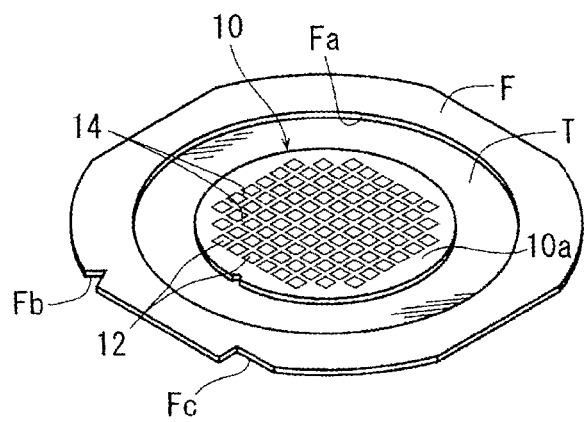
FIG. 7 is a perspective view illustrating the manner in which a wafer is supported on an annular frame by an adhesive tape.

The first thermocompression sheet S1 illustrated in FIG. 2A is a regular octagonal sheet, and the second thermocompression sheet S2 illustrated in FIG. 2B is a square sheet. The third thermocompression sheet S3 illustrated in FIG. 2C is a circular sheet, and the fourth thermocompression sheet S4 illustrated in FIG. 2D is a thermocompression sheet similar in shape to the contour of the frame F illustrated in FIG. 7 that has heretofore been in use. The fourth thermocompression sheet S4 has recesses S4b and S4c similar in shape to the recesses Fb and Fc defined in the frame F illustrated in FIG. 7. Though the first through third thermocompression sheets S1, S2, and S3 illustrated in FIGS. 2A through 2C are free of such recesses, they may have similar recesses. The thermocompression sheet used in the method according to the present invention is not limited to the first through fourth thermocompression sheets S1, S2, S3, and S4 illustrated in FIGS. 2A through 2D, may have an area larger than that of the wafer 10, and may be of any shape as long as it can be held on the chuck table 7 referred to above. In the description that follows, the first thermocompression sheet S1 illustrated in FIG. 2A that is made of polyethylene will be described and illustrated as the thermocompression sheet S according to the present embodiment, the thermocompression sheet S supporting the wafer 10 as illustrated in FIG. 7 while the wafer 10 is being processed.

Figure 3A:
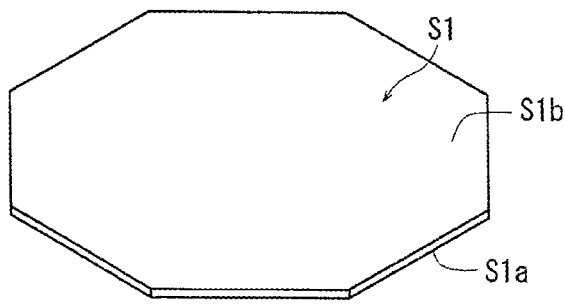
FIGS. 3A and 3B are perspective views illustrating the manner in which a thermocompression sheet is placed on a wafer in a workpiece supporting step.
Figure 3A:
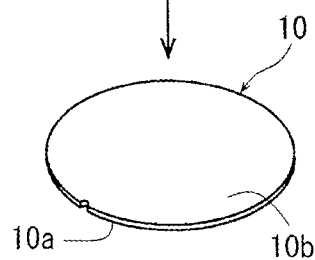
Figure 3B:
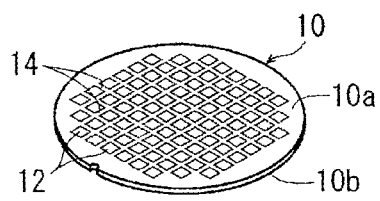
Figure 4A:
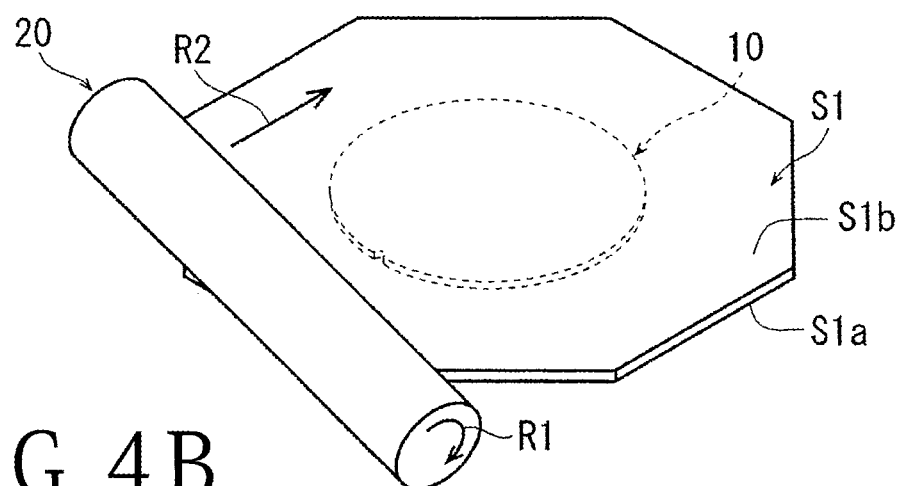
FIGS. 4A and 4B are perspective views illustrating the manner in which the thermocompression sheet is pressure-bonded to the wafer by a thermocompression roller in the workpiece supporting step.
Figure 4B:
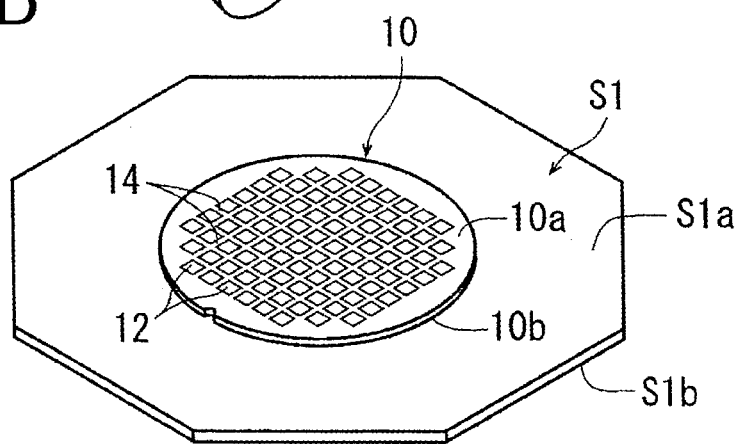

After the wafer 10 and the first thermocompression sheet S1 have been prepared, in order to place the wafer 10 on a face side S1a of the first thermocompression sheet S1, which will be an upper surface when the wafer 10 is to be processed, the face side S1a of the first thermocompression sheet S1 is directed toward a reverse side 10b of the wafer 10, and the wafer 10 is placed centrally on the first thermocompression sheet S1, as illustrated in FIG. 3A. Then, in order to pressure-bond the face side S1a of the first thermocompression sheet S1 to the reverse side 10b of the wafer 10, a thermocompression roller 20 that includes a heating unit disposed therein and has a temperature control unit for controlling the temperature of the surface of the thermocompression roller 20 to reach a predetermined heating temperature is positioned over the wafer 10, as illustrated in FIG. 4A. According to the present embodiment, since a polyethylene sheet is used as the first thermocompression sheet S1, the temperature of the surface of the thermocompression roller 20 is controlled to reach a heating temperature in the range of 120° C. to 140° C. close to the melting temperature of the polyethylene sheet. The surface of the thermocompression roller 20 is coated with a layer of fluororesin to prevent the first thermocompression sheet S1 from sticking to the surface of the thermocompression roller 20 even when the first thermocompression sheet S1 produces adhesive power. At the same time at which the temperature of the surface of the thermocompression roller 20 reaches the heating temperature, the thermocompression roller 20 is rotated about its central axis in the direction indicated by an arrow R1 and is moved in the direction indicated by an arrow R2, pressure-bonding the first thermocompression sheet S1 to the entire reverse side 10b of the wafer 10. The first thermocompression sheet S1 and the wafer 10 are thereby integrally combined with each other, making up an integral assembly (workpiece supporting step). FIG. 4B illustrates in perspective the manner in which the first thermocompression sheet S1 combined with the wafer 10 is turned upside down and placed on an unillustrated table after the workpiece supporting step has been carried out. When the first thermocompression sheet S1 is placed on the table, the wafer 10 combined with the first thermocompression sheet S1 has the face side 10a exposed upwardly. However, the present invention is not limited to such a wafer orientation. Instead, as illustrated in FIG. 3B, the face side 10a of the wafer 10 may be directed toward the face side S1a of the first thermocompression sheet S1, and the face side S1a of the first thermocompression sheet S1 may be pressure-bonded to and integrally combined with the face side 10a of the wafer 10.

After the workpiece supporting step has been carried out, the temperature of the first thermocompression sheet S1 drops, causing the first thermocompression sheet S1 to harden. The wafer 10 is now supported on only the first thermocompression sheet S1 thus hardened. The integral assembly, formed in the workpiece supporting step, of the first thermocompression sheet S1 and the wafer 10 supported on only the first thermocompression sheet S1 has a predetermined degree of rigidity. The predetermined degree of rigidity of the integral assembly is such that the first thermocompression sheet S1 will be kept flat when the first thermocompression sheet S1 is supported at two diametrically opposite points on its outer circumferential edge portion.

A plurality of wafers 10 supported on respective first thermocompression sheets S1 in the workpiece supporting step described above are stored in the cassette 3 illustrated in FIG. 1, and introduced into the cutting apparatus 1.

For carrying out the above cutting step as a processing step according to the present invention, one of the wafers 10 introduced into the cutting apparatus 1 is taken out of the cassette 3 by the loading/unloading mechanism 4 and temporarily placed on the temporary rest table 5. Then, the wafer 10 is delivered by the delivery mechanism 6 to the suction chuck 7a of the chuck table 7 positioned in the loading/unloading area illustrated in FIG. 1, and held under suction on the suction chuck 7a. The clamps 7b grip and secure the outer circumferential edge portion of the first thermocompression sheet S1. The wafer 10 held on the chuck table 7 is moved by the X-axis moving mechanism from the loading/unloading area to the alignment area directly below the alignment unit 8. The alignment unit 8 detects one of the projected dicing lines 14 as the region to be cut, and aligns the detected projected dicing line 14 with the X-axis direction and also with the cutting blade 9a. Then, as illustrated in FIG. 5A, the wafer 10 is moved in the X-axis direction by the X-axis moving mechanism to the processing area where the wafer 10 is positioned directly below the cutting unit 9 by the X-axis moving mechanism.

Figure 5A:
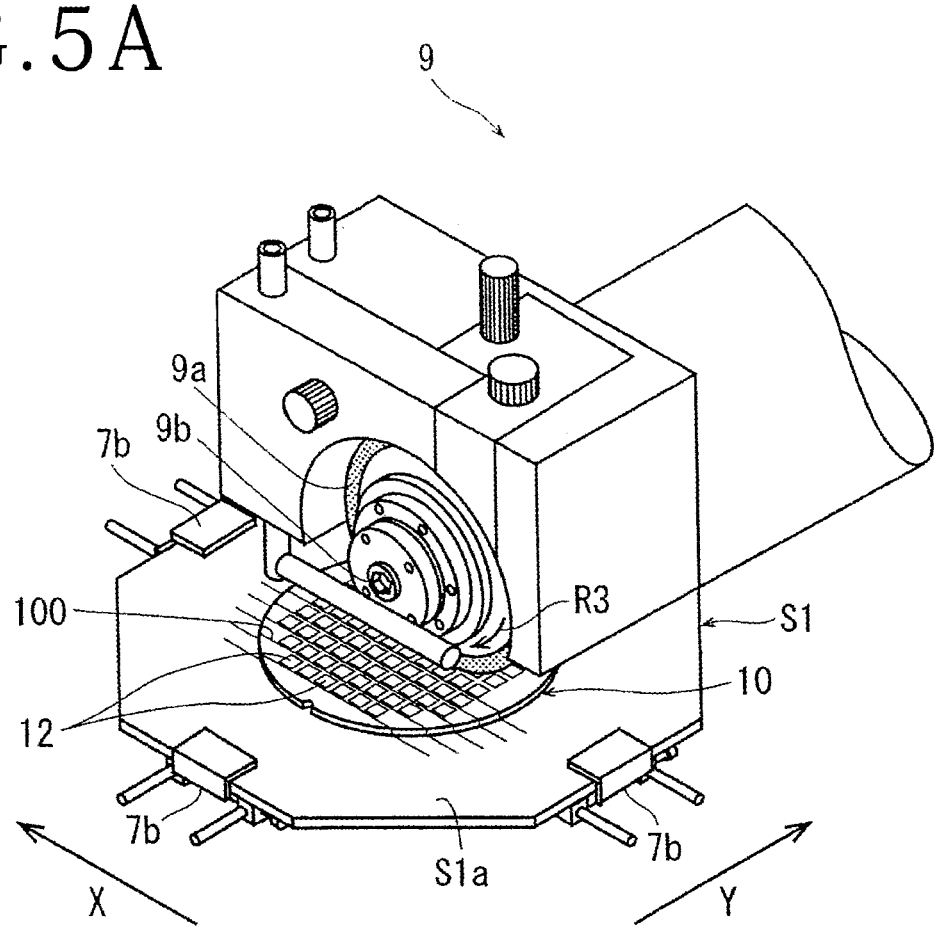
FIGS. 5A and 5B are perspective views illustrating the manner in which a cutting step according to the present embodiment is performed as a processing step.

As illustrated in FIG. 5A, the cutting unit 9 includes a rotational shaft, or a spindle, 9b that extends in the Y-axis direction and that is rotatably supported for rotation about its central axis parallel to the Y-axis direction and an annular cutting blade 9a mounted on a distal end of the rotational shaft 9b. The cutting blade 9a is movable by the Y-axis moving mechanism so as to be indexing-fed in the Y-axis direction, as described above. The rotational shaft 9b is rotatable about its central axis by a spindle motor, not illustrated.

Figure 5B:
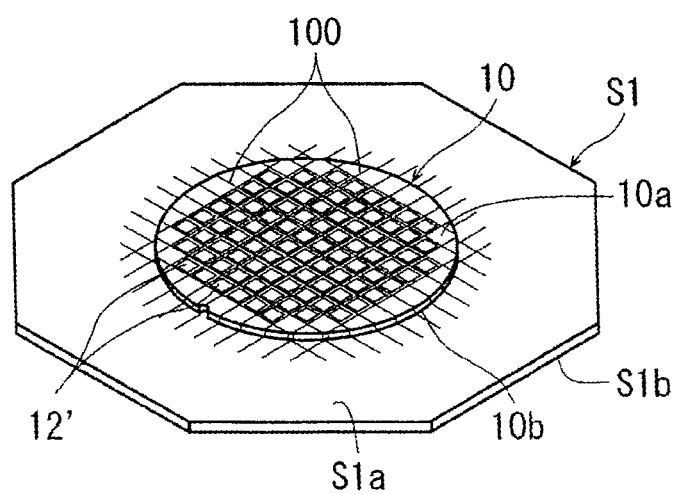

After the wafer 10 has been positioned directly below the cutting unit 9, the cutting blade 9a that is being rotated at a high speed in the direction indicated by an arrow R3 is positioned on the projected dicing line 14 aligned with the X-axis direction. The cutting blade 9a is then lowered or incising-fed by the Z-axis moving mechanism to cut into the wafer 10 from the face side 10a thereof while the chuck table 7 is being processing-fed in the X-axis direction, thereby forming a cut groove 100 as illustrated in FIG. 5A. The cutting step is repeated until cut grooves 100 are formed in the wafer 10 along all the projected dicing lines 14 established on the wafer 10, as illustrated in FIG. 5B. The cutting step is carried out as described above to divide the wafer 10 along the projected dicing lines 14 into individual device chips 12'. The division of the wafer 10 is now completed.

Even after the wafer 10 has been divided into the individual device chips 12' in the cutting step, the device chips 12' are still kept together in a wafer configuration similar in shape to the wafer 10 as a whole because the device chips 12' are supported on the first thermocompression sheet S1.

After the cutting step has been carried out as described above, an expanding step and a pick-up step are carried out to pick up the device chips 12' from the first thermocompression sheet S1 as described below. The expanding step and the pick-up step are carried out using a pick-up apparatus 40 illustrated in FIGS. 6A and 6B. The pick-up apparatus 40 includes an expanding mechanism 42 for carrying out the expanding step of expanding the first thermocompression sheet S1 in its plane to expand the distances between adjacent ones of the device chips 12'.

Figure 6A:
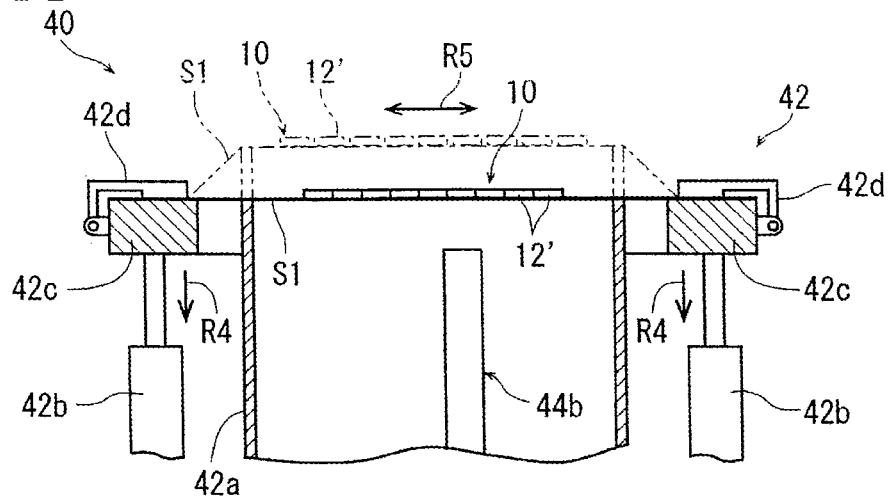
FIG. 6A is a cross-sectional view, partly in side elevation, illustrating the manner in which an expanding step is carried out.
Figure 6B:
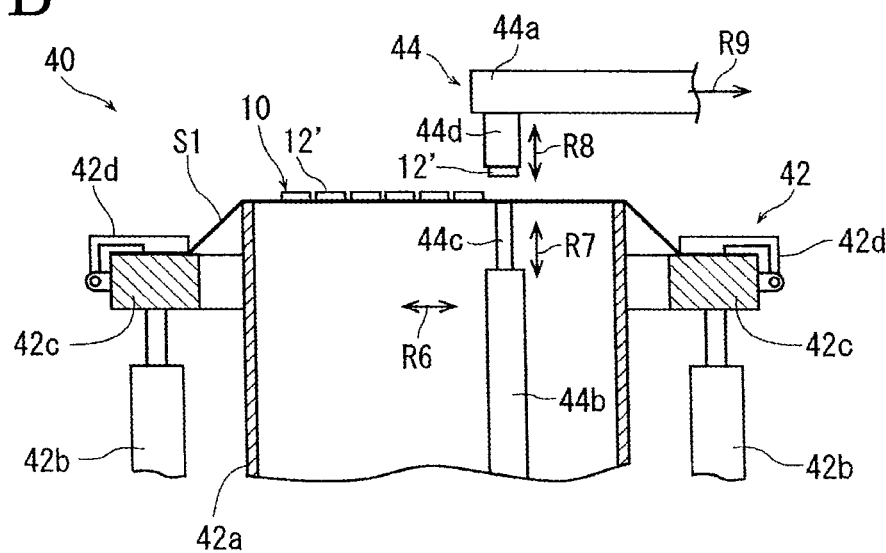
FIG. 6B is a cross-sectional view, partly in side elevation, illustrating the manner in which a pick-up step is carried out.

As illustrated in FIGS. 6A and 6B, the expanding mechanism 42 includes a hollow cylindrical expansion drum 42a, a plurality of upwardly extending air cylinders 42b disposed adjacent to and around the expansion drum 42a and angularly spaced circumferentially around the expansion drum 42a, an annular holder 42c joined to each of upper ends of piston rods of the air cylinders 42b, and a plurality of clamps 42d mounted on an outer circumferential surface of the holder 42c and angularly spaced circumferentially around the holder 42c. In FIGS. 6A and 6B, some components are illustrated in cross section for illustrative purposes. According to the present embodiment, the expansion drum 42a has an inside diameter equal to or larger than the diameter of the wafer 10, and has an outside diameter smaller than the diameter of the first thermocompression sheet S1. The holder 42c has an outside diameter commensurate with the diameter of the first thermocompression sheet S1, so that the first thermocompression sheet S1 is placed on the holder 42c, and the first thermocompression sheet S1 has an outer circumferential edge portion placed on a flat upper surface of the holder 42c.

As illustrated in FIGS. 6A and 6B, the air cylinders 42b lift and lower the holder 42c between a reference position where the upper surface of the holder 42c lies substantially at the same height as the upper end of the expansion drum 42a indicated by the solid lines and an expanding position where the upper surface of the holder 42c is lower than the upper end of the expansion drum 42a indicated by the two-dot-and-dash lines. In FIGS. 6A and 6B, the expansion drum 42a is illustrated as being lifted and lowered with respect to the holder 42c for illustrative purposes. In practice, however, the holder 42c is lifted and lowered with respect to the expansion drum 42a.

As illustrated in FIG. 6B, the pick-up apparatus 40 further includes a pick-up unit 44 in addition to the expanding mechanism 42. The pick-up unit 44 includes a pick-up collet 44a for sucking one device chip 12' at a time and a pusher mechanism 44b that is disposed in the expansion drum 42a and that pushes a device chip 12' upwardly. The pusher mechanism 44b is movable horizontally in the directions indicated by an arrow R6, and includes a push rod 44c that can be protruded and retracted in the vertical directions indicated by an arrow R7.

As illustrated in FIG. 6B, the pick-up collet 44a is movable horizontally and vertically. The pick-up collet 44a is fluidly connected to a suction source, not illustrated, that draws air in the direction indicated by an arrow R9, thereby creating a negative pressure in a suction nose 44d mounted on a distal end of the pick-up collet 44a to attract a device chip 12' under suction on a lower end surface of the suction nose 44d.

In the expanding step, as illustrated in FIG. 6A, the first thermocompression sheet S1 with the wafer 10 as divided into the individual device chips 12' facing upwardly is placed on the upper surface of the holder 42c that is disposed in the reference position. Then, the clamps 42d are actuated to secure the outer circumferential edge portion of the first thermocompression sheet S1 to the upper surface of the holder 42c. Then, the holder 42c is lowered in the direction indicated by an arrow R4 toward the expanding position, exerting tensile forces on the wafer 10 supported centrally on the first compression thermocompression sheet S1, in radially outward directions indicated by an arrow R5. At this time, the heating unit, not illustrated, is energized to heat the first thermocompression sheet S1 to a temperature close to the melting point of the material thereof, thereby softening the first thermocompression sheet S1. As indicated by the two-dot-and-dash lines in FIG. 6A, an area, of the first thermocompression sheet S1, that supports the wafer 10 thereon is expanded in its plane, widening the distances between adjacent ones of the device chips 12'. In a case where the cut grooves 100 formed in the wafer 10 along the projected dicing lines 14 in the cutting step are wide enough, the expanding step may be omitted.

After the expanding step has been carried out as described above, as illustrated in FIG. 6B, the suction nose 44d of the pick-up collet 44a is positioned above one of the device chips 12' that is to be picked up, and the pusher mechanism 44b is moved horizontally in a direction indicated by the arrow R6, to a position below the device chip 12' to be picked up. Then, the push rod 44c of the pusher mechanism 44b is extended in an upward direction indicated by the arrow R7, pushing up the device chip 12' from below. Concurrently, the pick-up collet 44a is lowered in a direction indicated by an arrow R8, and attracts the device chip 12' under suction on the lower end surface thereof. Then, the pick-up collet 44a is lifted to peel the device chip 12' off from the first thermocompression sheet S1, thereby picking up the device chip 12'. Then, the device chip 12' that has been picked up is delivered to a container, not illustrated, such as a tray, or to a predetermined position for a next step. The above pick-up process is carried out successively on all the device chips 12' on the first thermocompression sheet S1 (pick-up step).

After the pick-up step has been carried out as described above, the first thermocompression sheet S1 is discarded into a dustbin and disposed of (discarding step). The first thermocompression sheet S1 is much less costly than the frame F (see FIG. 7) that has heretofore been used, only the first thermocompression sheet S1 is required, and the first thermocompression sheet S1 is rigid enough to hold the wafer 10 thereon. Therefore, the frame F is not required, and no tedious and time-consuming work has to be performed for maintenance to make the frame F reusable, so that the method of processing a plate-shaped workpiece is of increased productivity.

The present invention is not limited to the embodiment described above. According to the above embodiment, the processing step of processing the wafer 10 to divide the wafer 10 into a plurality of device chips 12' is the cutting step of positioning the cutting blade 9a in alignment with the projected dicing lines 14 on the wafer 10 and cutting the wafer 10 with the cutting blade 9a along the projected dicing lines 14 to form the cut grooves 100 in the wafer 10 along the projected dicing lines 14. However, the processing step may instead be a laser ablation step of applying a laser beam having a wavelength absorbable by the wafer 10 to a region to be divided of the wafer 10 along the projected dicing lines 14 to form grooves in the wafer 10 along the projected dicing lines 14 by way of laser ablation. Alternatively, the cutting step described above may be replaced with a modified layer forming step of applying a laser beam having a wavelength transmittable through the wafer 10, to a region to be divided of the wafer 10 while positioning a focused spot of the laser beam within the wafer 10 to form modified layers in the wafer 10 along the projected dicing lines 14. In a case where the grooves are formed in the wafer 10 along the projected dicing lines 14 in the laser ablation step or the modified layers are formed in the wafer 10 along the projected dicing lines 14 in the modified layer forming step, the wafer 10 can more reliably be divided into individual device chips 12' by external forces imposed thereon in the expanding step.

According to the embodiment described above, a polyethylene sheet is illustrated as the thermocompression sheet S1. However, the thermocompression sheet S1 may be a polyolefin-based sheet other than a polyethylene sheet or a polyester-based sheet. A polyolefin-based sheet other than a polyethylene sheet may be either a polypropylene sheet or a polystyrene sheet, and a polyester-based sheet may be either a polyethylene terephthalate sheet or a polyethylene naphthalate sheet.

If a polypropylene sheet is selected as the thermocompression sheet S, then the heating temperature in the workpiece supporting step should preferably be in the range of 160° C. to 180° C. If a polystyrene sheet is selected as the thermocompression sheet S, then the heating temperature in the workpiece supporting step should preferably be in the range of 220° C. to 240° C. Further, if a polyethylene terephthalate sheet is selected as the thermocompression sheet S, then the heating temperature in the workpiece supporting step should preferably be in the range of 250° C. to 270° C. If a polyethylene naphthalate sheet is selected as the thermocompression sheet S, then the heating temperature in the workpiece supporting step should preferably be in the range of 160° C. to 180° C. At any rate, the above temperature ranges are close to the melting temperatures of the respective materials of the thermocompression sheet S. When heated as described above, the thermocompression sheet S softens to produce adhesive power and is pressure-bonded to the wafer 10. Since the thermocompression sheet S is used to support the wafer 10 thereon, when the device chips 12' are picked up from the thermocompression sheet S in the pick-up step, no adhesive sticks to and remains on the device chips 12'.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A method of processing a plate-shaped workpiece, comprising:
   a workpiece supporting step of placing the plate-shaped workpiece on a thermocompression sheet whose area is larger than that of the plate-shaped workpiece, heating the thermocompression sheet to pressure-bond the thermocompression sheet to the plate-shaped workpiece, and supporting the plate-shaped workpiece on the thermocompression sheet without using an annular frame;
   a step of gripping and securing an outer circumferential edge portion of the thermocompression sheet by means of a plurality of clamps which directly contact the outer circumferential edge portion;
   a processing step of processing the plate-shaped workpiece to divide the plate-shaped workpiece into a plurality of chips; and
   a pick-up step of picking up the chips from the thermocompression sheet.

2. The method of processing a plate-shaped workpiece according to claim 1, further comprising:
   an expanding step of expanding the thermocompression sheet to widen distances between the chips including heating the thermocompression sheet.

3. The method of processing a plate-shaped workpiece according to claim 1, further comprising:

after the pick-up step, a discarding step of discarding the thermocompression sheet.

4. The method of processing a plate-shaped workpiece according to claim 1, wherein the processing step includes a cutting step of positioning a cutting blade on a region to be divided of the plate-shaped workpiece and cutting the plate-shaped workpiece with the cutting blade.

5. The method of processing a plate-shaped workpiece according to claim 1, wherein the processing step includes a laser ablation step of applying a laser beam having a wavelength absorbable by the plate-shaped workpiece to a region to be divided of the plate-shaped workpiece to form grooves in the plate-shaped workpiece by way of laser ablation.

6. The method of processing a plate-shaped workpiece according to claim 1, wherein the processing step includes a modified layer forming step of applying a laser beam having a wavelength transmittable through the plate-shaped workpiece to a region to be divided of the plate-shaped workpiece while positioning a focused spot of the laser beam within the plate-shaped workpiece, to form modified layers in the plate-shaped workpiece.

7. The method of processing a plate-shaped workpiece according to claim 1, wherein the plate-shaped workpiece is a wafer including a face side having a plurality of devices formed in respective areas demarcated thereon by a plurality of projected dicing lines, the face side of the wafer or a reverse side thereof being placed on the thermocompression sheet.

8. The method of processing a plate-shaped workpiece according to claim 1, wherein the thermocompression sheet is either one of a polyolefin-based sheet and a polyester-based material.

9. The method of processing a plate-shaped workpiece according to claim 8, wherein the polyolefin-based sheet is selected and is either one of a polyethylene sheet, a polypropylene sheet, and a polystyrene sheet.

10. The method of processing a plate-shaped workpiece according to claim 9, wherein, if the polyethylene sheet is selected as the thermocompression sheet, a heating temperature to which the thermocompression sheet is heated in the workpiece supporting step ranges from 120° C. to 140° C., if the polypropylene sheet is selected as the thermocompression sheet, a heating temperature to which the thermocompression sheet is heated in the workpiece supporting step ranges from 160° C. to 180° C., and if the polystyrene sheet is selected as the thermocompression sheet, a heating temperature to which the thermocompression sheet is heated in the workpiece supporting step ranges from 220° C. to 240° C.

11. The method of processing a plate-shaped workpiece according to claim 8, wherein the polyester-based sheet is selected and is either one of a polyethylene terephthalate sheet and a polyethylene naphthalate sheet.

12. The method of processing a plate-shaped workpiece according to claim 11, wherein, if the polyethylene terephthalate sheet is selected as the thermocompression sheet, a heating temperature to which the thermocompression sheet is heated in the workpiece supporting step ranges from 250° C. to 270° C., and if the polyethylene naphthalate sheet is selected as the thermocompression sheet, a heating temperature to which the thermocompression sheet is heated in the workpiece supporting step ranges from 160° C. to 180° C.

* * * * *